United States Patent
Han et al.

(10) Patent No.: US 7,106,000 B2
(45) Date of Patent: Sep. 12, 2006

(54) EL DEVICE WITH ELECTRODE LAYER FOR NOISE REDUCTION AND FABRICATION METHOD THEREOF

(75) Inventors: Wan Soo Han, Hwaseong (KR); Ho Seok Ko, Suwon (KR); Sang Hoon Lee, Suwon (KR); Young Woo Lee, Suwon (KR)

(73) Assignee: Hansung Elcomtec Co., Ltd., Gyeonggi-do (KR)

( * ) Notice: Subject to any disclaimer, the term of this patent is extended or adjusted under 35 U.S.C. 154(b) by 198 days.

(21) Appl. No.: 10/617,153

(22) Filed: Jul. 8, 2003

(65) Prior Publication Data
US 2004/0085013 A1 May 6, 2004

(30) Foreign Application Priority Data
Nov. 4, 2002 (KR) .................... 10-2002-0067981

(51) Int. Cl.
*H05B 33/14* (2006.01)
*H05B 33/22* (2006.01)
*H01L 51/50* (2006.01)

(52) U.S. Cl. .................. 313/506; 313/498; 313/503; 313/512

(58) Field of Classification Search ............... 313/498, 313/503, 506, 512
See application file for complete search history.

(56) References Cited

FOREIGN PATENT DOCUMENTS

JP          11273872 A  * 10/1999

* cited by examiner

*Primary Examiner*—Mariceli Santiago
*Assistant Examiner*—Anthony Perry
(74) *Attorney, Agent, or Firm*—Robert E. Bushnell, Esq.

(57) ABSTRACT

An ElectroLuminescent (EL) device includes a transparent electrode layer, a luminescent layer, and insulation layer, a rear electrode layer, a first protection layer adapted to cover the luminescent layer and the insulation layer and the rear electrode layer, and an electrode layer for noise reduction sequentially arranged on an insulated substrate; and a second protection layer adapted to cover the electrode layer for noise reduction.

10 Claims, 1 Drawing Sheet

EL DEVICE WITH ELECTRODE LAYER FOR NOISE REDUCTION AND FABRICATION METHOD THEREOF

BACKGROUND OF THE INVENTION

1. Field of the Invention

The present invention relates to an ElectroLuminescent (EL) device used as parts such as backlight of cellular phone, more particularly, to an EL device capable of reducing audio noise and electrical noise by alternating current power and a fabrication method of the EL device.

2. Description of Related Art

An inorganic EL (electroluminescent) device driven by alternating current power is possessed of electrical noise by characteristics of the alternating current power that is a driving power source. Particularly, a power source used in mobile phone is a direct current power, wherein transforming direct current power into a power source of sine wave similar to alternating current through an inverter and providing the transformed power source of sine wave to the EL device generally use the mobile phone. The transformed power source of sine wave used in the mobile phone generates electrical noise and audio noise as polarity of dielectric layer is being changed by alternating current power a phase of which is changed.

An EL device used as a backlight of a mobile phone, for example, comprises a transparent electrode layer that is formed of ITO and formed on a transparent insulation substrate such as PolyEthylene Terephthalate (PET) film as a first electrode, a luminescent layer and an insulation layer as a dielectric layer sequentially formed on the transparent electrode layer, a rear electrode layer as a second electrode formed on the insulation layer, and a protection layer formed to envelope the luminescent layer, the insulation layer and the rear electrode layer.

The EL device further comprises a ground electrode that is formed on the protection layer, and a dielectric rear tape that is formed on the ground electrode, wherein the ground electrode is formed of a copper plate, and the dielectric rear tape is adhered onto the ground electrode to insulate the ground electrode from the outside.

In such an EL device, the transparent electrode layer and rear electrode layer are used as two electrodes of front electrode and rear electrode respectively to be connected to an output terminal of an inverter, wherein AC power is supplied to the two electrodes. Furthermore, the ground electrode is grounded to a substrate. Therefore, the EL device has three terminals including two electrodes that are connected to the output terminal of the inverter and the ground electrode that is connected to a ground terminal.

The EL device transforms DC power of battery through the inverter and provides transformed sinusoidal AC power to the electrodes, since the DC power of battery is used as a power source of the EL device.

Therefore, light is emitted from the luminescent layer, if the sinusoidal AC power that is transformed through the inverter is supplied to the transparent electrode layer and the rear electrode layer that act as two electrodes in an EL device having the foregoing structure.

However, there have been problems in such an EL device in that electrical noise is generated by the AC power, and audio noise is generated from the dielectric layer as phase of an AC power is alternately being changed.

Furthermore, there have been problems in that although a copper plate used as the ground electrode is formed on the protection layer to reduce noise, the copper plate has to be adhered to the EL device through a separate process, and a ground electrode has to be formed additionally so that the additionally formed ground electrode is grounded to the substrate.

Furthermore, there have been problems in that since an insulation tape surely has to be adhered to the copper plate so that the insulation tape encircles the copper plate so as to insulate the copper plate from the outside, not only process is cumbersome and complex, but also it is difficult to apply the insulation tape to a device to which the insulation tape is not required to be adhered, or to which the insulation tape is partially adhered although it is possible to apply the insulation tape to a backlight of LCD (liquid crystal display) to all over the front of which the insulation tape is required to be adhered.

SUMMARY OF THE INVENTION

The present invention is suggested to solve the foregoing problems, and it is an object of the present invention to provide an EL device with electrode capable of reducing audio noise and electrical noise generated by AC power.

It is another object of the present invention to provide an EL device capable of simplifying processes by forming an electrode for noise removal during the fabrication process of the EL device, thereby excluding separate copper plate adhering process, ground electrode forming process and insulation tape adhering process, and a fabrication method of the EL device.

It is another object of the present invention to provide an EL device in which an electrode for noise removal is integrally fabricated to be applied to various flat panel devices, and a fabrication method of the EL device.

It is the other object of the present invention to provide an EL device capable of removing noise by forming two terminals only with the EL device itself without separate copper plate and ground electrode for noise removal, and a fabrication method of the EL device.

In order to achieve the foregoing objects, the present invention provides an EL device comprising: a transparent electrode layer, a luminescent layer, and insulation layer, a rear electrode layer, a first protection layer adapted to cover the luminescent layer and the insulation layer and the rear electrode layer, and an electrode layer for noise reduction sequentially arranged on an insulated substrate; and a second protection layer adapted to cover the electrode layer for noise reduction.

Furthermore, the present invention provides an ElectroLuminescent (EL) device comprising: a transparent electrode layer formed on an insulation substrate; a luminescent layer formed on the transparent electrode layer; an insulation layer formed on the luminescent layer; a rear electrode layer formed on the insulation layer; a first protection layer adapted to cover the luminescent layer, the insulation layer and the rear electrode layer; an electrode layer adapted to reduce noise, the electrode layer formed on the first protection layer; and a second protection layer adapted to cover the electrode layer for noise reduction.

BRIEF DESCRIPTION OF THE DRAWINGS

Further objects and advantages of the present invention can be more fully understood from the following detailed description taken in conjunction with the accompanying drawing in which.

DETAILED DESCRIPTION OF THE INVENTION

Figure 1:
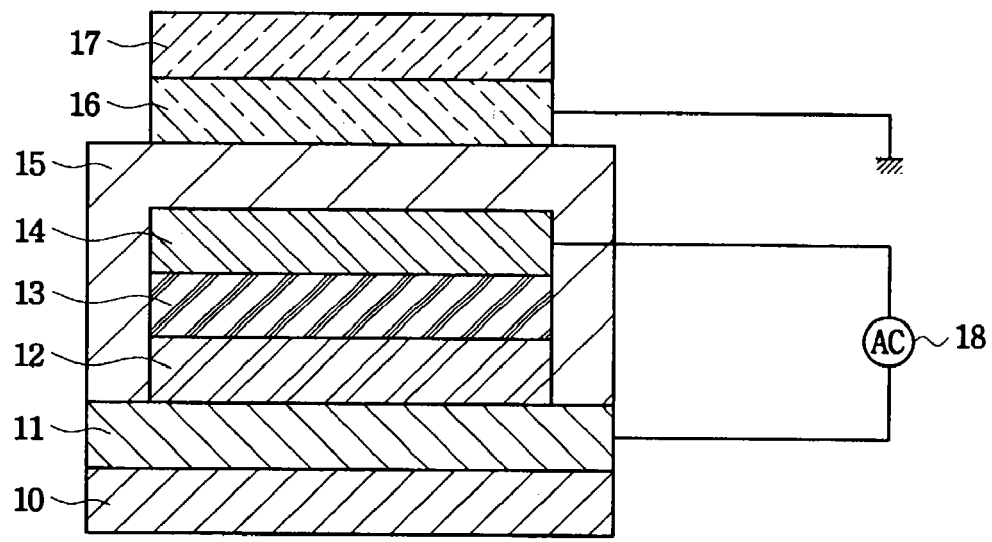
FIG. 1 is a cross-sectional view of an EL device on which a ground electrode is formed.

FIG. 1 is a cross-sectional structure of an EL device used as a backlight of a mobile phone, for example.

Referring to FIG. 1, an EL device comprises a transparent electrode layer 11 that is formed of ITO and formed on a transparent insulation substrate 10 such as PolyEthylene Terephthalate (PET) film as a first electrode, a luminescent layer 12 and an insulation layer 13 as a dielectric layer sequentially formed on the transparent electrode layer 11, a rear electrode layer 14 as a second electrode formed on the insulation layer 13, and a protection layer 15 formed to envelope the luminescent layer 12, the insulation layer 13 and the rear electrode layer 14.

The EL device further comprises a ground electrode 16 that is formed on the protection layer 15, and a dielectric rear tape 17 that is formed on the ground electrode 16, wherein the ground electrode 16 is formed of a copper plate, and the dielectric rear tape 17 is adhered onto the ground electrode 16 to insulate the ground electrode 16 from the outside.

In such an EL device, the transparent electrode layer 11 and rear electrode layer 14 are used as two electrodes of front electrode and rear electrode respectively to be connected to an output terminal of an inverter (not illustrated in drawing), wherein AC power 18 is supplied to the two electrodes 11 and 14. Furthermore, the ground electrode 16 is grounded to a substrate. Therefore, the EL device has three terminals including two electrodes 11 and 14 that are connected to the output terminal of the inverter and the ground electrode 16 that is connected to a ground terminal.

The EL device transforms DC power of battery through the inverter and provides transformed sinusoidal AC power 18 to the electrodes 11 and 14, since the DC power of battery is used as a power source of the EL device.

Therefore, light is emitted from the luminescent layer 12, if the sinusoidal AC power 18 that is transformed through the inverter is supplied to the transparent electrode layer 11 and the rear electrode layer 14 that act as two electrodes in an EL device having the foregoing structure.

The present invention will now be described in detail in connection with an exemplary embodiment with reference to the accompanying drawings. For reference, like reference characters designate corresponding parts throughout several views.

Figure 2:
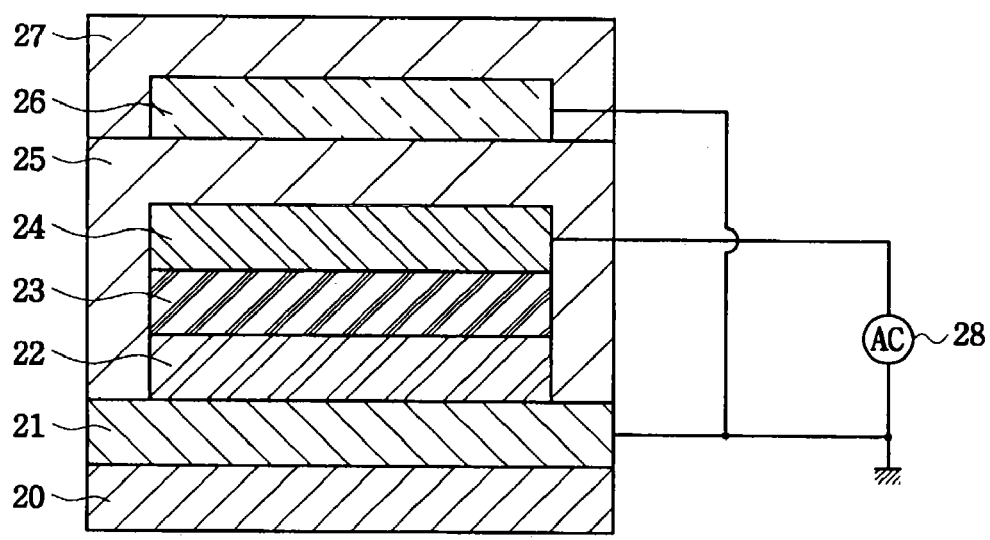
FIG. 2 is a cross-sectional view of an EL device according to an embodiment of the present invention.

FIG. 2 illustrates a cross-sectional structure of an EL device used as backlight of cellular phone according to an embodiment of the present invention.

Referring to FIG. 2, an EL device of the present invention comprises a transparent electrode layer 21 formed of ITO and formed on a transparent insulation substrate 20 such as a PolyEthylene terephthalate (PET) film as a first electrode, a luminescent layer 22 as a phosphor layer formed on the transparent electrode layer 21, an insulation layer 23 as a dielectric layer formed on the luminescent layer 22, and a rear electrode layer 24 as a second electrode formed on the insulation layer 23.

Furthermore, the EL device of the present invention further comprises a first protection layer 25 formed to envelope the luminescent layer 22, the insulation layer 23 and the rear electrode layer 24, an electrode layer 26 for noise reduction formed on the first protection layer 25, and a second protection layer 27 formed to envelope the electrode layer 26 for noise reduction.

The electrode layer 26 for noise reduction is commonly grounded along with the transparent electrode layer 21 that is first electrode, and is connected to one of the output terminals of an inverter (not shown in the drawings) so that the substrate is grounded.

Conductive electrode materials can be used as the electrode layer 26 for noise reduction, and the electrode layer 26 for noise reduction is formed on the first protection layer 25 by printing a metallic electrode material such as Ag in one preferred embodiment of the present invention.

The first protection layer 25 and the second protection layer 27 not only prevent penetration of moisture from the outside, but also function as an insulation layer between electrodes. The first protection layer 25 and the second protection layer 27 are formed by printing a material having superior moisture resistance, pressure resistance and insulating characteristics, e.g. polyester.

In an EL device of the present invention, light is emitted from the luminescent layer 22 since DC power of a battery is transformed through an inverter (not shown in the drawings) so that sinusoidal AC power 28 is provided to the transparent electrode layer 21 and the rear electrode layer 24 that are used as two electrodes.

The EL device of the present invention not only reduces electrical noise generated from the transparent electrode layer 21 and the rear electrode layer 24 due to the AC power, but also reduces audio noise generated from the dielectric layer by the AC power by forming the electrode layer 26 for noise reduction on the first protection layer 25, commonly grounding the electrode layer 26 along with the transparent electrode layer 21 and connecting the electrode layer 26 to one electrode in output electrodes of the inverter, thereby grounding the substrate.

The foregoing EL device according to an embodiment of the present invention has merits in that electrical noise and audio noise due to AC power are reduced by forming an electrode layer for noise reduction between protection layers, commonly grounding the electrode layer together with a transparent electrode layer.

The present invention simplifies processes by excluding the cumbersomeness that occurs when a separate copper plate is adhered to the EL device and a ground electrode is formed and grounded with the substrate or adhering an insulation tape to the copper plate, since an electrode for noise removal is formed during the process of fabricating the EL device, and insulation is performed by a protection film. Therefore, an EL device of the present invention has merits in that noise is removed by the EL device itself, and the EL device can be applied to various flat display devices.

While the present invention has been particularly shown and described with reference to an exemplary embodiment thereof, it will be understood by those skilled in the art that the foregoing and other changes in form and detail can be made therein without departing from the spirit and scope of the invention.

What is claimed is:

1. An ElectroLuminescent (EL) device comprising:
   a transparent electrode layer, a luminescent layer, and insulation layer, a rear electrode layer, a first protection layer adapted to cover the luminescent layer and the insulation layer and the rear electrode layer to prevent penetration of moisture from both faces and sides thereof, and an electrode layer for noise reduction sequentially arranged on an insulated substrate; and
   a second protection layer of a single layer printed material adapted to cover the electrode layer for noise reduction.

2. The EL device according to claim 1, the electrode layer for noise reduction is commonly grounded along with the transparent electrode layer so as to be connected to one electrode out of two electrodes of the EL device.

3. The EL device according to claim 1, the electrode layer for noise reduction comprising a conductive electrode material.

4. The EL device according to claim 3, the electrode layer for noise reduction comprising Ag.

5. The EL device according to claim 1, the first and second protection layers function as a protection film for preventing penetration of moisture from outside and an insulation film for insulating between electrodes.

6. The EL device according to claim 5, the first and second protection layers comprising polyester.

7. An ElectroLuminescent (EL) device comprising:
a transparent electrode layer formed on an insulation substrate;
a luminescent layer formed on the transparent electrode layer;
an insulation layer formed on the luminescent layer;
a rear electrode layer formed on the insulation layer;
a first protection layer adapted to cover the luminescent layer, the insulation layer and the rear electrode layer to prevent penetration of moisture from both faces and sides thereof;
an electrode layer adapted to reduce noise, the electrode layer formed on the first protection layer; and
a second protection layer of a single layer printed material adapted to cover the electrode layer for noise reduction.

8. The EL device according to claim 7, further comprising forming the electrode layer for noise reduction of a conductive electrode material.

9. The EL device according to claim 7, wherein the first and second protection layers are adapted to form a protection film to prevent penetration of moisture from outside and to electrically insulate the electrode layer from the rear electrode.

10. The EL device according to claim 9, wherein the first and second protection layers are formed of polyester.

* * * * *